(12) United States Patent
Hundemer et al.

(10) Patent No.: US 9,137,616 B1
(45) Date of Patent: Sep. 15, 2015

(54) SYSTEMS AND METHODS FOR IDENTIFYING A MUTE/SOUND SAMPLE-SET ATTRIBUTE (71) Applicant: Tribune Broadcasting Company, LLC, Chicago, IL (US)

(72) Inventors: Hank J. Hundemer, Bellevue, KY (US); Dana A. Lasher, Morgan Hill, CA (US)

(73) Assignee: Tribune Broadcasting Company, LLC, Chicago, IL (US)

(*) Notice: Subject to any disclaimer, the term of this patent is extended or adjusted under 35 U.S.C. 154(b) by 462 days.

(21) Appl. No.: 13/629,430

(22) Filed: Sep. 27, 2012

Related U.S. Application Data (60) Provisional application No. 61/542,077, filed on Sep. 30, 2011, provisional application No. 61/542,103, filed on Sep. 30, 2011.

(51) Int. Cl.
*H04R 29/00* (2006.01)
(52) U.S. Cl.
CPC ..................... *H04R 29/00* (2013.01)
(58) Field of Classification Search
CPC ............ H04N 21/254; H04N 21/4424; H04N 21/4425; H04N 21/6547; H04N 21/6582; H04N 5/60; H04N 5/765; H04N 21/42203; H04N 21/4334; H04N 21/440236; H04N 21/4532; H04N 21/485
USPC ............... 381/55–59, 104, 107, 109; 700/94; 725/32, 18, 9, 13, 14
See application file for complete search history.

(56) References Cited

U.S. PATENT DOCUMENTS

| | | | |
|---|---|---|---|
| 6,195,458 B1 | 2/2001 | Warnick et al. | |
| 6,535,611 B1* | 3/2003 | Lau | 381/104 |
| 6,553,272 B1* | 4/2003 | Lau | 700/94 |
| 6,606,409 B2 | 8/2003 | Warnick et al. | |
| 6,721,361 B1 | 4/2004 | Covell et al. | |
| 6,724,933 B1 | 4/2004 | Lin et al. | |
| 6,778,224 B2 | 8/2004 | Dagtas et al. | |
| 2006/0013414 A1* | 1/2006 | Shih | 381/107 |
| 2006/0026628 A1* | 2/2006 | Wan et al. | 725/32 |
| 2007/0061833 A1* | 3/2007 | Deng | 725/18 |
| 2009/0249386 A1 | 10/2009 | Shan et al. | |

* cited by examiner

*Primary Examiner* — Lun-See Lao
(74) *Attorney, Agent, or Firm* — McDonnell Boehnen Hulbert & Berghoff LLP (57) ABSTRACT

Presently described are systems and methods for identifying a mute/sound attribute of an audio sample set having first-channel samples and second-channel samples. An embodiment takes the form of a method that includes: (i) receiving the audio sample set; (ii) for each first-channel sample, determining a first max amplitude and a first min amplitude; (iii) calculating a first span based on a first function of the first max amplitude and the first min amplitude; (iv) for each second-channel sample, determining a second max amplitude and a second min amplitude; (v) calculating a second span based on a function of the second max amplitude and the second min amplitude; and (vi) identifying the audio sample set as having a sound attribute if both the first span and the second span are greater than a min-volume threshold.

20 Claims, 4 Drawing Sheets

SYSTEMS AND METHODS FOR IDENTIFYING A MUTE/SOUND SAMPLE-SET ATTRIBUTE

CROSS REFERENCE TO RELATED APPLICATIONS

This application claims priority to U.S. Provisional Patent Application Ser. No. 61/542,077, entitled "System and Method for Automated Video Content Tagging," filed on Sep. 30, 2011 and U.S. Provisional Patent Application Ser. No. 61/542,103, entitled "System and Method for a Master Controller," filed on Sep. 30, 2011, both of which are hereby incorporated by reference herein in their entirety.

This application also relates to U.S. patent application Ser. No. 13/629,405, entitled "Systems and Methods for Identifying a Black/Non-Black Frame Attribute," U.S. patent application Ser. No. 13/629,481, entitled "Systems and Methods for Identifying a Colorbar/Non-Colorbar Frame Attribute," U.S. patent application Ser. No. 13/629,495, entitled "Systems and Methods for Identifying a Video Aspect-Ratio Frame Attribute," U.S. patent application Ser. No. 13/629,446, entitled "Systems and Methods for Identifying a Scene-Change/Non-Scene-Change Transition Between Frames," and U.S. patent application Ser. No. 13/629,497, entitled "Systems and Methods for Electronically Tagging a Video Component in a Video Package," all of which are commonly assigned to the assignee of the present application, are filed simultaneously, and are hereby incorporated by reference herein in their entirety.

USAGE AND TERMINOLOGY

Throughout this application, with respect to all reasonable derivatives of such terms, and unless otherwise specified (and/or unless the particular context clearly dictates otherwise), each usage of:

"a" or "an" is meant to read as "at least one."
"the" is meant to be read as "the at least one."
the term "audio" refers broadly to any material represented in an audio format. Audio (or portions thereof) may have a low enough level of loudness such that the audio is logically characterized as being mute, or may have a sufficient level such that it is logically characterized as having sound. Audio may be substantive such as a musical work, sound effects, dialog, etc., or may be non-substantive such as testing tones, static, or noise. Audio may also be configured as a single channel (i.e., mono) or as multi-channel (e.g., stereo).
the term "sample set" refers to a plurality of samples representing a portion of audio. In one example, a sample set may include audio samples that correspond to a frame of video.
the term "video" refers broadly to any material represented in a video format (i.e., having a plurality of frames). In some instances, video may include a plurality of sequential frames that are identical or nearly identical, and that may give the impression of a "still" image. Video may also include frames that merely show a black screen, colorbars, testing data, or other traditionally non-substantive content. It should be noted that while non-substantive content may have little or no utility to a typical viewer, it provides useful information for the purpose of the techniques described throughout this disclosure. Video may or may not include an audio portion.
the term "video component" (VC) refers to video that one of ordinary skill in the art would typically consider to be self-contained, and that is typically separately scheduled by a scheduling-and-sequencing system (also commonly referred to as a traffic system) in a broadcasting environment. There are several types of VCs, including for example a show-segment VC, a barter VC, and a promotion VC. A show-segment VC consists of at least a portion of a show, and potentially one or more commercials, all of which are grouped together and considered as one unit for the purpose of scheduling-and-sequencing. A show may be, for example, an episode of a sitcom, a news program, or a movie. A barter VC consists of one or more commercials, all of which are grouped together and considered as one unit for the purpose of scheduling-and-sequencing. A barter VC is a subset of a show-segment VC, namely the portion including the one or more commercials. A promotion VC consists of a promotion or advertisement (e.g., for an associated show).
the term "video package" refers to a collection of VCs and other video, all of which has a logical or other relationship or association. Typically, the video package includes a plurality of sequentially ordered VCs that are separated by other video (e.g., black frames), although the video package may have the technical appearance of being a single, continuous piece of video when analyzed using traditional methods. Each video package includes at least one, and often a group of show-segment VCs that are intended to be aired during a corresponding thirty-minute, one-hour, two-hour, or other predefined time slot. Though not required, a video package is often created by a show syndicator and provided to a broadcaster.

TECHNICAL FIELD

The present systems and methods relate to audio sampling analysis and, more particularly, to systems and methods for identifying a mute/sound sample-set attribute.

BACKGROUND

Sound is a mechanical wave that is an oscillation of pressure transmitted through a solid, liquid, or gas, composed of frequencies within a range that can be heard and/or felt (typically from 20 Hz to 20 KHz). Audio technology relates to the electronic representation of sound. When using an analog recording technique, audio signals are stored as a continuous wave in or on a recording medium. When using a digital recording technique, audio signals may be stored as, for example, representative data points or samples.

In digital recording, the accuracy of the digital signal's representation of the wave (i.e., the underlying sound) is dependent on, among other things, the sampling rate, which specifies how many samples are taken per unit of time. For example, the sampling rate typically used for "CD-quality" audio is 44.1 kHz, meaning 44,100 samples are taken per second to represent the wave. A sample refers to a value at a point in time. A plurality of samples representing a portion of audio is referred to as a sample set. In the case of a wave, a sample represents the amplitude at an associated location on the wave. As more samples of the wave are taken, the wave is more accurately represented by the digital signal, thereby allowing for improved quality in the playback of the originally recorded sound.

Audio has many properties, including loudness, as an example. Loudness, sometimes referred to as volume, is a level of auditory sensation having a value on a scale extending from quiet to loud. The loudness level is determined by the amplitude at a given location of the wave. When the loudness level is at or near the quiet end of the scale (e.g., a low amplitude), the audio is often characterized as being silent or "mute." Due to static and noise that are present in audio recordings, the audio may still be considered mute even when a slight level of loudness is present. As such, the mute characterization is typically used when audio has no (or only an insignificant amount of) loudness, and would therefore be logically characterized (e.g., by a listener) as being mute. When the loudness level is not at or near the quiet end of the scale (such that it has a relatively high amplitude), the audio is often characterized as having "sound."

Audio is commonly organized as a single channel (i.e., mono) or as multi-channel (i.e., with two or more associated channels), where multi-channel is often used to create a sense of space and/or direction of sound. For example, a stereo-channel configuration includes two separate (but associated) audio signals, typically identified as left and right channels. Multi-channel configurations having more than two channels are commonly used to simulate surround sound, but still typically include the left and right channels.

Audio technology is also closely related to video technology, which relates to electronically capturing, processing, recording, and reconstructing a sequence of still images referred to as frames, so as to represent motion. Video includes a number of frames based on a predefined frame rate. For example, in the U.S., the Advanced Television Systems Committee ("ATSC") establishes a standard frame rate of 29.97 frames/second for video used for commercial over-the-air television broadcasting. Video may also be transmitted via a digital video signal (e.g., based on the high definition serial digital interface (HD-SDI) standard). Once captured and processed, video is typically encoded and recorded as a digital file. Thereafter, the file is retrieved and the video is reconstructed by decoding the file.

Audio is often embedded in and/or otherwise associated with video. As an example, a signal based on the HD-SDI standard represents not only video but also up to 16 channels of audio with a 20 or 24-bit sampling rate of 48 kHz. As such, each frame of video may have an associated audio sample set (i.e., representing the sound associated with that frame).

Since the HD-SDI standard or other standards may provide or include more audio channels than were used when a given set of audio was recorded, often the audio associated with one or more of the recorded channels is duplicated and used for the additional channels. For example, when mono audio is played out from a first source and then recorded by a second source (e.g., using the HD-SDI standard), the same (or substantially the same) audio from the single channel may be effectively copied and used as both the left and right channels. This process is often referred to as audio "up conversion." Thereafter, when the recorded audio is played back, the same (or substantially the same) audio is heard on both the left and right channels. Notably, noise and static often prevent two or more channels in this instance from being identical, but in most instances, they are at least substantially similar.

For a variety of reasons, such as to analyze systems, identify commercials, and assist with video and/or audio editing, there is a desire to analyze sample sets and identify in those sample sets select attributes such as the mute/sound attribute as described above.

SUMMARY

Disclosed herein are systems and methods for identifying a mute/sound sample-set attribute and/or for identifying a mono/multi-channel sample-set attribute that improve upon traditional approaches, including those described above.

One example advantage of the present systems and methods is the ability to identify a mute/sound sample-set attribute and/or to identify a mono/multi-channel sample-set attribute, while minimizing or eliminating false-positive and false-negative results.

Another example advantage of the present systems and methods is the ability to identify a mute/sound sample-set attribute and/or to identify a mono/multi-channel sample-set attribute associated with a frame of video, for a plurality of frames, while contemporaneously processing each frame to create an encoded file, wherein corresponding steps for each sample set are performed during an execution time period that is less than a reciprocal of a frame rate of the video.

Various embodiments of the present systems and methods may have none, some, or all of these advantages. Other advantages will be readily apparent to those of ordinary skill in the art.

A first example embodiment takes the form of a non-transitory computer-readable medium containing instructions that, when executed by a processor, cause a set of steps to be carried out for identifying a mute/sound attribute of a current sample set of audio, the current sample set having a plurality of first-channel samples and a plurality of second-channel samples. The set of steps includes: (i) receiving the current sample set; (ii) for each first-channel sample, determining a first max amplitude and a first min amplitude; (iii) calculating a first span based on a first function of the first max amplitude and the first min amplitude; (iv) for each second-channel sample, determining a second max amplitude and a second min amplitude; (v) calculating a second span based on a function of the second max amplitude and the second min amplitude; (vi) identifying the current sample set as having a sound attribute responsive to two conditions being satisfied, the first of the conditions being that the first span is greater than a min-volume threshold, the second of the conditions being that the second span is greater than the min-volume threshold, and (vii) storing an indication of an associated mute/sound frame attribute in a memory.

A second example embodiment takes the form of a sample-set processing device comprising: a processor and the non-transitory computer-readable medium described in the preceding paragraph.

A third example embodiment takes the form of the method described two paragraphs above, where the current sample set is received from a source device.

BRIEF DESCRIPTION OF THE DRAWINGS

For a more complete understanding of the present systems and methods, reference is now made to the following descriptions, taken in conjunction with the accompanying drawings, in which:

FIG. 2 (FIGS. 2A-2B) is a flow chart illustrating an example method in accordance with at least one embodiment;

DETAILED DESCRIPTION OF THE DRAWINGS

Figure 1:
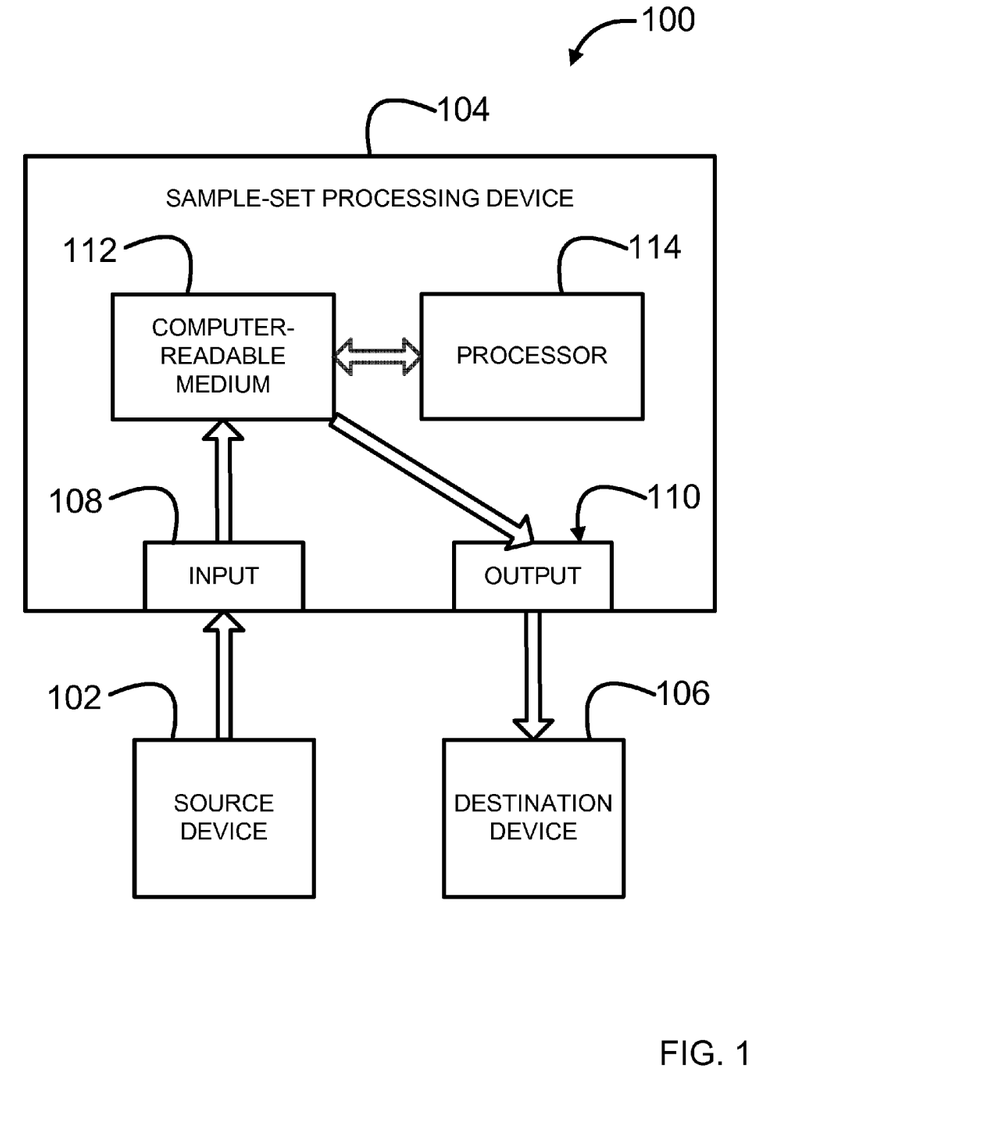
FIG. 1 is an example system in accordance with at least one embodiment.

Turning now to FIG. 1, an example system is provided and is generally designated 100. Included in the system 100 are a source device 102, a sample-set processing device 104, and a destination device 106. Example source devices 102 include satellite receivers, decoders, baseband fiber transcoders, DVD players, Internet-delivery based playout devices (e.g. Pathfire devices provided by DG FastChannel, Inc. of Irving, Tex.), and other sample-set processing devices. The sample-set processing device 104 includes an audio input connection 108 and is configured for receiving audio via the audio input connection from the source device 102.

An audio output connection 110 on the sample-set processing device 104 is configured for sending audio to a destination device 106 (for, e.g., playout of the audio) which may include one or more of the example source devices listed above. Further, the sample-set processing device 104 includes a non-transitory computer-readable medium 112 and a processor 114. In the sample-set processing device 104, the audio input connection 108, the audio output connection 110, the computer-readable medium 112, and the processor 114 may all be directly or indirectly electronically connected with one another. In the system 100, the sample-set processing device 104, the source device 102, and the destination device 106 may all be directly or indirectly electronically connected with one another (via, e.g., the audio input connection 108 and the audio output connection 110).

The computer-readable medium 112 contains instructions that, when executed by the processor 114, cause a set of steps to be carried out for identifying a mute/sound sample-set attribute. It is noted that the described steps throughout this application need not be performed in the disclosed order, although in some embodiments, an order of select steps is evident from context. Also, not all steps need to be performed to achieve the desired advantages of the presently disclosed systems and methods, and therefore not all steps are required.

While it is contemplated that the sample-set processing device 104 may only process sample sets of audio (i.e., no frames of video), in one embodiment, the sample-set processing device is or includes a frame-processing device where the audio input connection 108 and the audio output connection 110 are further configured to receive, process, and send video. In one embodiment, the sample-set processing device 104 is configured for receiving audio associated with raw baseband video based on the HD-SDI standard with a data transfer rate in the range of 1.4 Gbps-1.6 Gbps (and typically approximately 1.485 Gbps). Throughout this disclosure, unless otherwise stated, all disclosed ranges are inclusive of the stated bound values. The sample-set processing device 104 may be configured for receiving video and/or audio based on other standards including but not limited to those defined by the Society of Motion Picture and Television Engineers ("SMPTE") as well as those of the ATSC.

As discussed above, video typically includes a plurality of frames and audio typically includes a plurality of sample sets; in at least one embodiment, the present method is applied to each frame of video and an associated sample set of audio. However, for clarity, the present method is described herein with reference to a "current" frame and/or an associated "current" sample set being received from the source device 102 (e.g., as the source device plays out the audio and video) by the sample-set processing device 104 via the audio input connection 108.

Figure 2A:
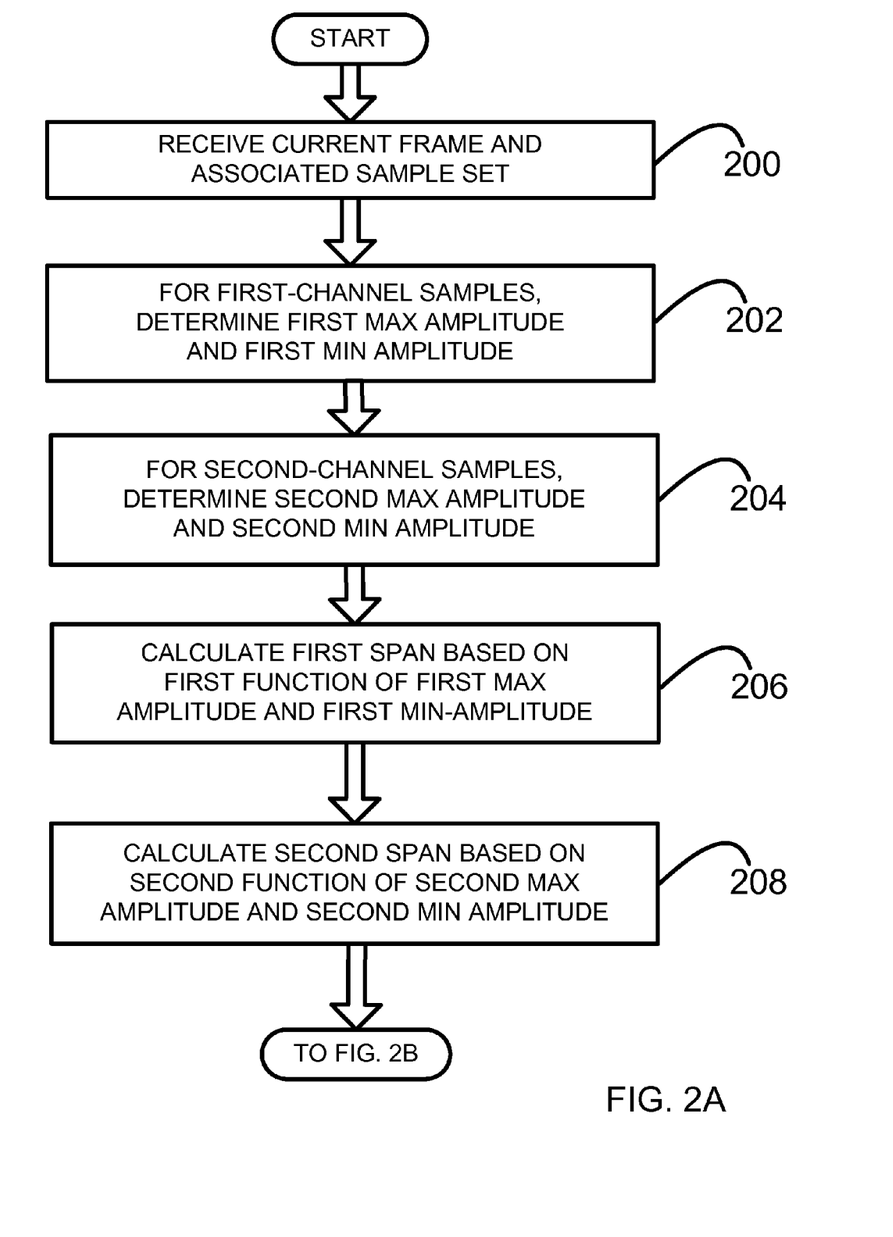
Figure 2B:
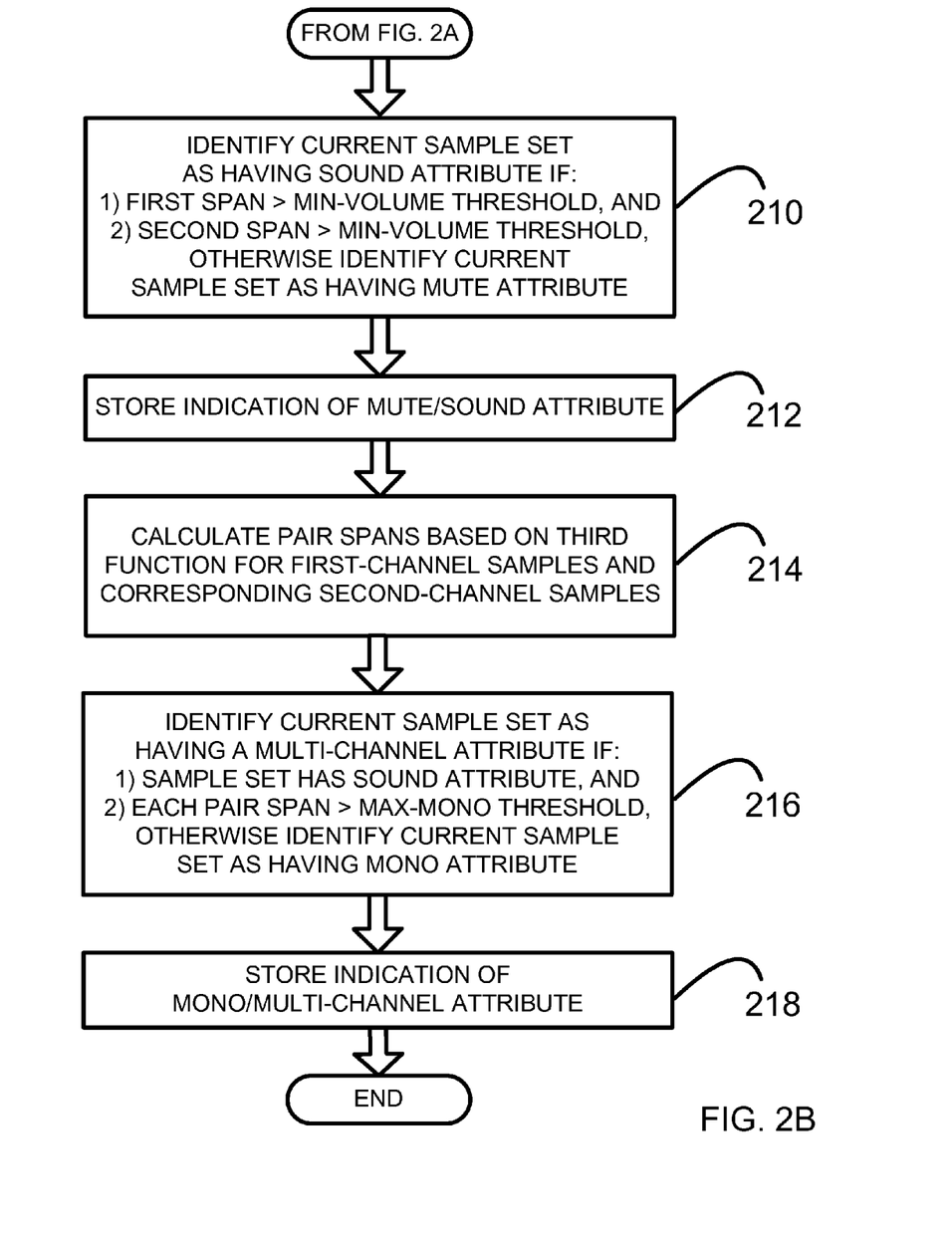
Figure 3:
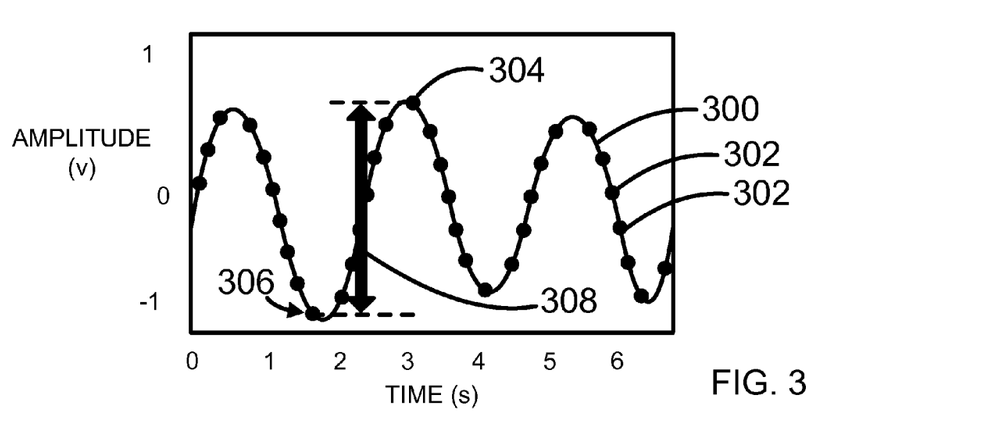
FIG. 3 is a graphical depiction of a sound wave associated with a first channel of audio, together with a depiction of a plurality of quantized-level samples representing the sound wave in accordance with at least one embodiment.
Figure 4:
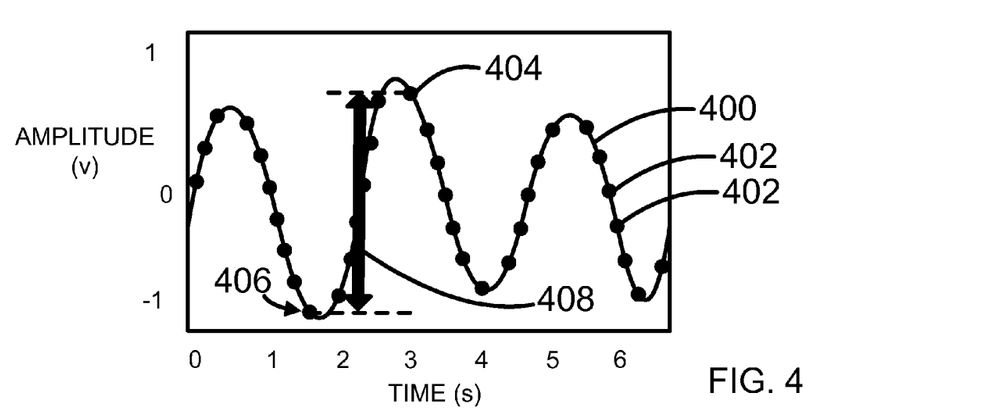
FIG. 4 is a graphical depiction of a sound wave associated with a second channel of audio, together with a depiction of a plurality of quantized-level samples representing the sound wave in accordance with at least one embodiment, the second channel of audio being associated with the first channel of audio associated with FIG. 3.

Turning now to FIG. 2, a flow chart illustrating the set of steps, and an example of the present method, is shown. At step 200, a current frame of the video and an associated sample set is received. Included in the sample set is a plurality of first-channel samples and a plurality of second-channel samples (both as quantized-level samples). FIG. 3 shows a graphical depiction of a sound wave 300 associated with a first channel of audio, together with a depiction of the plurality of first-channel samples 302 representing the sound wave, and FIG. 4 shows a graphical depiction of a sound wave 400 associated with a second channel of audio, together with a depiction of a plurality of second-channel samples 402 representing the sound wave. In the example provided, the first and second channels are associated left and right channels (e.g., in a signal based on the HD-SDI standard), and represent audio that was originally recorded in mono, but that was up-converted as discussed above. As shown in FIGS. 3 and 4, the waves defined by the first and second-channel samples vary (i.e., differ) slightly from one another.

Such variation in the first and second channels may result from a variety of factors. For example, when raw analog audio is played back and recorded on a recording device (e.g., during an up-conversion process), noise and jitter are often introduced as a result of the quantizing and/or the decoding/encoding process. The carrying out of additional steps in the present method provides for an analysis of the degree of this variation to determine whether the sample set should be appropriately identified as having a mono or a multi-channel attribute. Notably, as with the mute/sound sample-set attribute, the mono/multi-channel attribute is intended to describe the nature of the originally recorded audio. For example, if mono audio is up-converted and recorded in a stereo format, the audio (and therefore the included sample sets) would still be identified as having a mono attribute.

Returning to FIG. 2, at step 202, for each of the first-channel samples 300, a first max amplitude 304 and a first min amplitude 306 are determined (i.e., representing maximum and minimum samples, respectively). Similarly, at step 204, for each of the second-channel samples 400, a second max amplitude 404 and a second min amplitude 406 are determined. Since the samples are quantized-level samples, and therefore a representation of the underlying sound, it should be noted that the above-identified max amplitude and min amplitude values may not reflect actual maximum and minimum values of the corresponding sound wave, but instead represent the maximum and minimum samples of the wave.

At step 206, a first span 308 is calculated based on a first function of the first max amplitude 304 and the first min amplitude 306. Similarly, at step 208, a second span 408 is calculated based on a second function of the second max amplitude 404 and the second min amplitude 406. In at least one embodiment, the first and second functions are subtraction functions (e.g., subtracting the first min amplitude from the first max amplitude), but other functions are contemplated and can also be used.

At step 210, the current sample set is identified as having a sound attribute if at least one condition—and in some embodiments two conditions—are met. Otherwise, the current sample set is identified as having a mute attribute. Before describing the two example conditions, it should be noted that, in some embodiments, it may be desired to apply a shift-register-right technique on the encoded representation of the sounds waves 300, 400 to increase processing efficiency and/or to intentionally filter noise. For example, in one embodiment, an 8-bit or 4-bit shift-register-right technique may be applied on 20-bit or 24-bit audio, thereby providing 16-bit audio (with a quantized level range of approximately +/−16 k).

The first condition is that the first span 308 is greater than a min-volume threshold, which, for high-definition frames in at least one embodiment, is a value in a range from 80 to 120, and in a particular embodiment is approximately 100. Notably, threshold ranges described in this context reflect the use of 16-bit audio, and may be adjusted proportionally depending on the appropriate quantized level range. This first condition ensures that the associated portion of audio has a sufficient level of loudness such that it would be logically characterized as having sound (i.e., not mute). On the contrary, a wave representing sound with a low level of loudness (i.e., that would logically be characterized as being mute) is likely to have a relatively low max amplitude and a relatively high min amplitude, and therefore the first span is likely to have a relatively low value—below the min-volume threshold, that is. This first condition is effective particularly due to the positive correlation between the first span and the loudness of the audio.

Similarly, the second condition is that the second span is greater than the min-volume threshold. In some embodiments, additional spans (i.e., associated with additional channels) may be calculated and compared to the min-volume threshold. However, empirical testing shows that testing two spans provides the optimal balance of yielding highly accurate results while minimizing the use of system resources. It should be noted that in some embodiments, only a single span may be calculated and compared to the min-volume threshold.

To promote efficiency, short-circuiting logic techniques may be employed when testing the above-described conditions. As such, if one condition is not satisfied, the remaining conditions are not tested and the sample set is identified as having a mute attribute. Accordingly, in one embodiment, the two conditions are tested in the order recited, although notably such an order is not required. At step 212, an indication of the associated mute/sound attribute is stored in a memory (e.g., in the computer-readable medium 112), among other things, for later retrieval and use by other applications.

In addition to identifying whether the current sample set has a sound attribute (or rather a mute) attribute, it may be desired to identify whether the current sample set has a multi-channel attribute (or rather a mono) attribute. To make this determination, at step 214, pair spans are calculated based on a third function for each (or at least a portion) of the first-channel samples and a corresponding (e.g., as defined by the HD-SDI protocol) second-channel sample. In at least one embodiment, the third function is a combination of an absolute-value function and a subtraction function (e.g., a first-channel sample is subtracted from a corresponding second-channel sample, and the absolute value of that difference is the returned result), but other functions are contemplated and can be used.

At step 216, the current sample set is identified as having a multi-channel attribute if two conditions (referred to here as the third and fourth conditions) are satisfied. Otherwise, it is identified as having a mono attribute. The third condition is that the sample set has a sound attribute (perhaps determined in the manner discussed above). If the third condition is not met, the sample set has a mute attribute and therefore it can properly be identified as having a mono attribute (i.e., since both channels are mute, the audio channels are the same or substantially the same, and the sample set is appropriately characterized as being mono).

The fourth condition is that each of the plurality of pair spans 308, 408 is greater than a max-mono threshold, which for high-definition frames may be a value in a range 100 to 156, and in a particular embodiment is approximately 128 (which, again, may be scaled according to the quantized level range). The testing of this condition checks whether any difference between two samples in a given pair (i.e., for associated channels) is minimal, and if so that such a minimal difference is appropriately considered to be insignificant for the purposes of identifying a multi-channel attribute (e.g., as a result of static or noise).

As with the conditions related to the sound/mute attribute, to promote efficiency, short-circuiting logic techniques may be employed when testing the conditions related to the mono/multi-channel attribute. The third and fourth conditions may be tested in the order recited, although such an order is not required. At step 218, an indication of the associated mono/multi-channel attribute is stored in a memory (e.g., in the computer-readable medium 112), for, among other things, later retrieval and use by other applications.

In at least one embodiment, the herein-described set of steps is carried out for a sample set associated with each frame of baseband video as it is received across the audio input connection 108 in real time or near real time. Such a configuration provides for performing the above-described steps while contemporaneously processing each frame to create an encoded file representing the video (the same may be done with the audio portion). Notably, when processing frames in real time or near real time (e.g., through use of a frame buffer), there is an inherent limitation in that the above-described steps (as applied to a current sample set) must be performed during an execution time period that is less than a reciprocal of the frame rate of the video (e.g., the steps of the present method must be performed within 1/29.97 seconds for video having a frame rate of 29.97 frames per second). Such time constraints present considerable challenges, particularly when the video is being transferred at a high data rate as the amount of data and the complexity of the calculations carried out by the processor 114 increase. However, due at least in part to the various optimization techniques described throughout this disclosure, the steps of the present method can be performed within limited time constraints and/or with a reduced use of system resources.

Notably, a frame-attribute table (or other data structure such as a linked list) may be used to store the indication of the associated mute/sound (and/or the mono/multichannel) attribute in a memory as described above. As such, in one embodiment, a table may store such indications for all frames of a video package. Further, a separate frame-transition table may also be generated that indicates attribute changes or transitions between frames (e.g. the transition from a frame A having a mute attribute to a frame B having a sound attribute may be indicated as a from-mute transition).

As one example of the efficiency of the present method, testing shows that the steps of the present method can be performed contemporaneously while processing each frame of video based on the HD-SDI standard (i.e., having a transfer rate of approximately 1.485 Gbps and a frame rate of 29.97 frames per second) using a quad-core processor, with each core having a speed of 2 GHz (e.g., a Xeon E5405 processor provided by Intel® of Santa Clara, Calif.).

One beneficial application of the present systems and methods is for use with the systems and methods for electronically tagging a VC in a video package that are described in the cross-referenced and incorporated U.S. patent application Ser. No. 13/629,497. As discussed therein, the ability to identify a mute/sound sample-set attribute and a mono/multichannel sample-set attribute with minimal processing power is particularly advantageous as select embodiments of the therein-disclosed systems and methods for electronically tagging a VC in a video package rely not only on the identification of these attributes, but also on the identification of several other frame attributes that, when combined, are restricted by the frame-rate time constraints as described above.

In some embodiments, video may also be obtained by decompressing and/or decoding an encoded file such as one stored on the computer-readable medium 112, or stored on the source device 102.

Although the present systems and methods have been described in terms of select embodiments, alterations and permutations of these embodiments will be apparent to those skilled in the art. Accordingly, the above description of example embodiments does not define or constrain the present systems and methods.

In particular, it is noted that, while some specific embodiments have been described using particular applied algorithms, the present systems and methods should not be construed as being limited to those particular implementations. For example, descriptions of iterative techniques can be implemented using recursive techniques, and vice-versa. Further, serial and parallel implementations can be interchanged. Similarly, it is contemplated that the use of logical structures including loops and condition statements can be modified, interchanged, or restricted without departing from the present systems and methods. Finally, it is contemplated that alternative data structures and/or storage techniques may be employed in implementing the techniques employed in the present systems and methods (e.g., data stored in a table may instead be stored in a linked list, tree, or other data structure). Other changes, substitutions, and alterations are also possible without departing from the present systems and methods in its broader aspects as set forth in the following claims.

The invention claimed is:

1. A non-transitory computer-readable medium containing instructions that, when executed by a processor, cause a set of steps to be carried out for identifying a mute/sound attribute of a current sample set of audio, said current sample set having a plurality of first-channel samples and a plurality of second-channel samples, said set of steps comprising:
   receiving said current sample set;
   for each said first-channel sample, determining a first max amplitude and a first min amplitude;
   calculating a first span based on a first function of said first max amplitude and said first min amplitude;
   for each said second-channel sample, determining a second max amplitude and a second min amplitude;
   calculating a second span based on a function of said second max amplitude and said second min amplitude; and
   identifying said current sample set as having a sound attribute responsive to two conditions being satisfied, the first of said conditions being that said first span is greater than a min-volume threshold, the second of said conditions being that said second span is greater than said min-volume threshold; and
   storing in a memory an indication of an associated mute/sound sample-set attribute.

2. The computer-readable medium of claim 1, wherein said computer-readable medium is included in a sample-set processing device having an audio and video input connection and configured to receive baseband video having a plurality of frames via said audio and video input connection.

3. The computer-readable medium of claim 2, wherein said computer-readable medium is configured for contemporaneously processing each frame to create an encoded file while performing said set of steps for an associated sample set of each frame, and wherein performance of said set of steps for each associated sample set occurs during an execution time period that is less than a reciprocal of a frame rate of said video.

4. The computer-readable medium of claim 3, wherein said video is received at a transfer rate having a value of 1.485 Gbps, and wherein said execution time period is less than or equal to 1/29.97 seconds.

5. The computer-readable medium of claim 1, wherein said computer-readable medium is configured to receive, from a source device, video having a plurality of frames with each frame having an associated sample set, wherein said computer-readable medium is configured to decode each frame and perform said set of steps for a sample set associated with each frame.

6. The computer-readable medium of claim 1, wherein said first channel is a left channel and said second channel is a right channel.

7. The computer-readable medium of claim 1, wherein said first and second functions are subtraction functions.

8. The computer-readable medium of claim 1, wherein said min-volume threshold is a value in a range from 80 to 120.

9. The computer-readable medium of claim 1, wherein, in said identifying step, said current sample set is identified as having a mute attribute if said current sample set is not identified as having a sound attribute.

10. The computer-readable medium of claim 1, said set of steps further comprising:
    calculating a plurality of pair spans based on a third function for each first-channel sample and a corresponding second-channel sample; and
    identifying said current sample set as having a multi-channel attribute responsive to two additional conditions being satisfied, the first of said additional conditions being that said current sample set has a sound attribute, the second of said additional conditions being that each pair span is greater than a max-mono threshold.

11. The computer-readable medium of claim 10, wherein said third function is a combination of an absolute-value function and a subtraction function.

12. The computer-readable medium of claim 10, wherein said max-mono threshold is a value in a range from 100 decimal to 156 decimal.

13. The computer-readable medium of claim 10, wherein, in said identifying step, said current sample set is identified as having a mono attribute if said current sample set is not identified as having a multi-channel attribute.

14. The computer-readable medium of claim 10, configured to test said first and second conditions, as well as said first and second additional conditions, in the order recited, and further configured to employ a short-circuiting logic technique.

15. A sample-set processing device comprising:
    a processor; and
    a non-transitory computer-readable medium containing instructions that, when executed by a processor, cause a set of steps to be carried out for identifying a mute/sound attribute of a current sample set of audio, said current sample set having a plurality of first-channel samples and a plurality of second-channel samples, said set of steps comprising:
        receiving said current sample set;
        for each said first-channel sample, determining a first max amplitude and a first min amplitude;
        calculating a first span based on a first function of said first max amplitude and said first min amplitude;

for each said second-channel sample, determining a second max amplitude and a second min amplitude;

calculating a second span based on a function of said second max amplitude and said second min amplitude; and identifying said current sample set as having a sound attribute responsive to two conditions being satisfied, the first of said conditions being that said first span is greater than a min-volume threshold, the second of said conditions being that said second span is greater than said min-volume threshold; and storing in a memory an indication of an associated mute/sound sample-set attribute.

16. The sample-set processing device of claim 15, further comprising an input connection, said sample-set processing device being configured to receive baseband video having a plurality of frames via said input connection, each frame having an associated sample set, said computer-readable medium configured for contemporaneously processing each frame to create an encoded file while performing said set of steps for each associated sample set, wherein performance of said set of steps for each associated sample set occurs during an execution time period that is less than a reciprocal of a frame rate of said video.

17. The sample-set processing device of claim 15, wherein said first channel is a left channel and said second channel is a right channel, and wherein said first and second functions are subtraction functions.

18. The sample-set processing device of claim 15, said set of steps further comprising:

calculating a plurality of pair spans based on a third function for each first-channel sample and a corresponding second-channel sample; and identifying said current sample set as having a multi-channel attribute responsive to two additional conditions being satisfied, the first of said additional conditions being that said current sample set has a sound attribute, the second of said additional conditions being that each pair span is greater than a max-mono threshold.

19. The sample-set processing device of claim 18, said set of steps further comprising storing in a memory an indication of an associated mono/multi-channel attribute.

20. A method of identifying a mute/sound attribute of a current sample set of audio, said current sample set having a plurality of first-channel samples and a plurality of second-channel samples, the method comprising:

receiving said current sample set from a source device;

for each said first-channel sample, determining a first max amplitude and a first min amplitude;

calculating a first span based on a first function of said first max amplitude and said first min amplitude;

for each second-channel sample, determining a second max amplitude and a second min amplitude;

calculating a second span based on a function of said second max amplitude and said second min amplitude;

identifying said current sample set as having a sound attribute responsive to two conditions being satisfied, the first of said conditions being that said first span is greater than a min-volume threshold, the second of said conditions being that said second span is greater than said min-volume threshold; and storing in a memory an indication of an associated.

* * * * *